United States Patent
Tao et al.

[11] Patent Number: 5,904,566
[45] Date of Patent: May 18, 1999

[54] REACTIVE ION ETCH METHOD FOR FORMING VIAS THROUGH NITROGENATED SILICON OXIDE LAYERS

[75] Inventors: Hun-Jan Tao; Chia-Shiung Tsai, both of Hsin-chu, Taiwan

[73] Assignee: Taiwan Semiconductor Manufacturing Company, Ltd., Hsin-Chu, Taiwan

[21] Appl. No.: 08/868,842

[22] Filed: Jun. 9, 1997

[51] Int. Cl.⁶ .................................................. H01L 21/46
[52] U.S. Cl. .................. 438/689; 438/712; 438/689; 438/695; 438/697; 438/733; 438/738
[58] Field of Search .................... 438/712, 689, 438/695, 697, 733, 738

[56] References Cited

U.S. PATENT DOCUMENTS

| | | | |
|---|---|---|---|
| 5,073,698 | 12/1991 | Stultz | 427/55 |
| 5,219,793 | 6/1993 | Cooper et al. | 438/624 |
| 5,269,879 | 12/1993 | Rhoades et al. | 438/712 |
| 5,391,915 | 2/1995 | Mukai et al. | 257/643 |
| 5,592,024 | 1/1997 | Aoyama et al. | 257/751 |
| 5,770,875 | 9/1996 | Assaderaghi et al. | 257/301 |
| 5,792,693 | 3/1997 | Tseng | 438/254 |
| 5,807,789 | 3/1997 | Chen et al. | 438/714 |

FOREIGN PATENT DOCUMENTS

0706206A2  10/1996  European Pat. Off. .

*Primary Examiner*—Charles Bowers
*Assistant Examiner*—Thanh Nguyen
*Attorney, Agent, or Firm*—George O. Saile; Stephen B. Ackerman; Alek P. Szecsy

[57] ABSTRACT

A method for forming a via through a nitrogenated silicon oxide layer. There is first provided a substrate. There is then formed over the substrate a nitrogenated silicon oxide layer. There is then formed upon the nitrogenated silicon oxide layer a patterned photoresist layer. Finally, there is then etched the nitrogenated silicon oxide layer through a reactive ion etch (RIE) plasma etch method while employing the patterned photoresist layer as a patterned photoresist etch mask layer to form a via through the nitrogenated silicon oxide layer. The reactive ion etch (RIE) method employs an etchant gas composition comprising: (1) a perfluorocarbon having a carbon:fluorine atomic ratio at least about 1:3; (2) oxygen; and (3) argon.

6 Claims, 2 Drawing Sheets

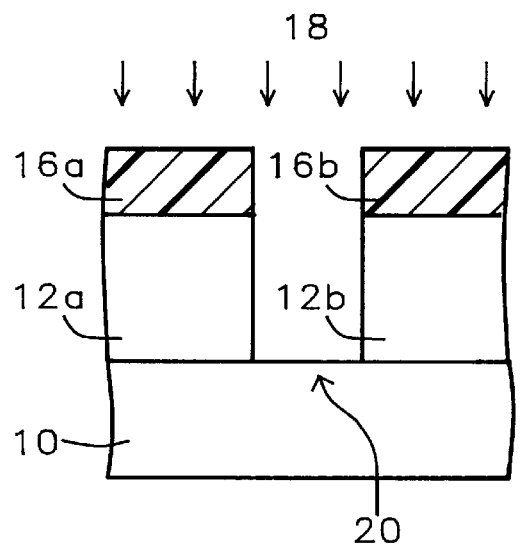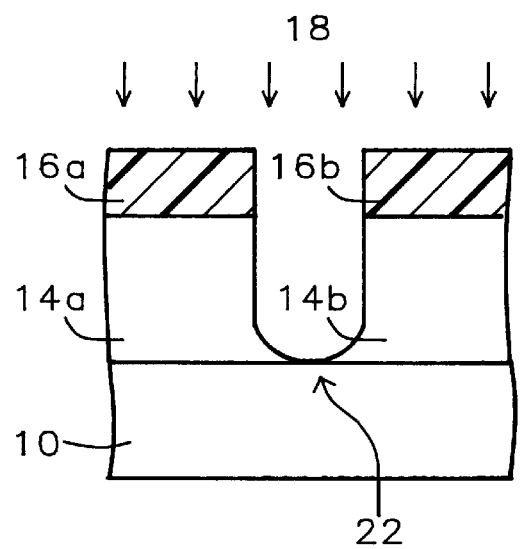
FIG. 1a – Prior Art
FIG. 1b – Prior Art
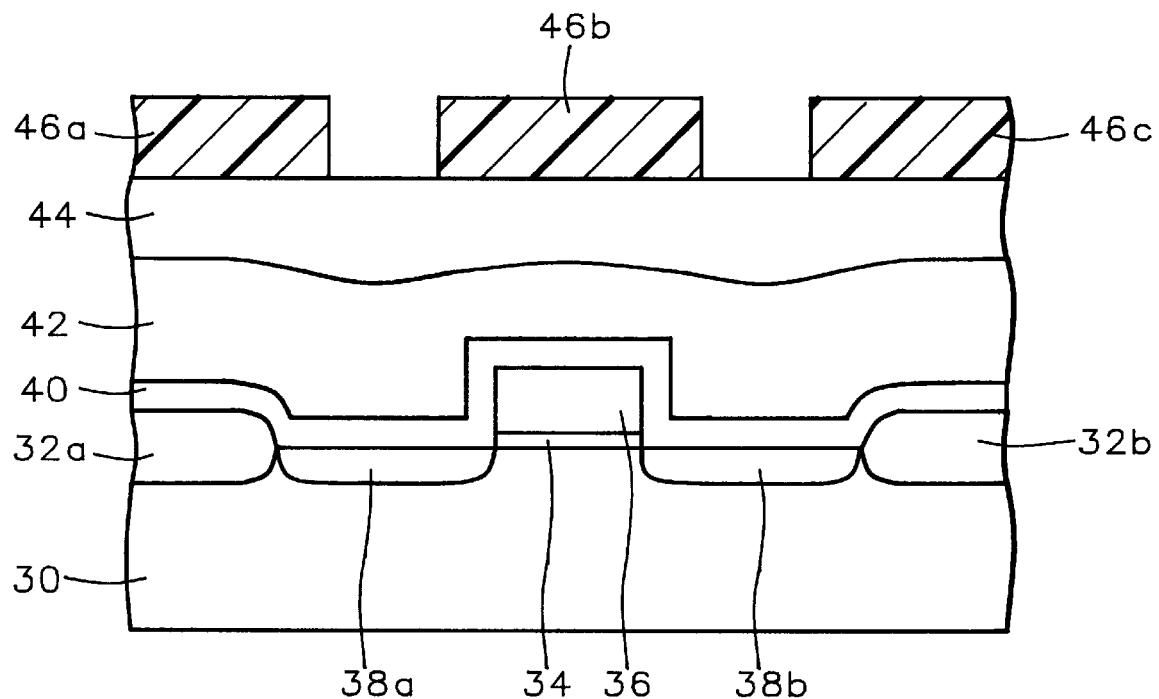
FIG. 2

REACTIVE ION ETCH METHOD FOR FORMING VIAS THROUGH NITROGENATED SILICON OXIDE LAYERS

BACKGROUND OF THE INVENTION

1. Field of the Invention

The present invention relates generally to methods for forming vias through integrated circuit layers within integrated circuits. More particularly, the present invention relates to methods for forming vias through nitrogenated silicon oxide integrated circuit layers within integrated circuits.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

As integrated circuit device densities have increased and integrated circuit device dimensions have decreased, it has become increasingly important to form through dielectric layers within advanced integrated circuits vias of reduced dimensions in order to provide a means for interconnecting through those dielectric layers patterned conductor layers of similarly reduced dimensions. In order to provide vias of reduced dimensions through dielectric layers within advanced integrated circuits, it is known in the art of advanced integrated circuit fabrication to employ high density plasma reactive ion etch (HDP-RIE) plasma etch methods when formiing those vias, since high density plasma reactive ion etch (HDP-RIE) plasma etch methods typically provide highly anisotropic reactive ion etch (RIE) plasmas through which high aspect ratio straight sided vias of diminished cross-sectional dimensions may be formed through dielectric layers within integrated circuits. When employed within advanced integrated circuits, such high density plasma reactive ion etch (HDP-RIE) plasma etch methods typically employ plasma densities of greater than about 1E11 per cubic centimeter. In comparison, conventional reactive ion etch (RIE) plasma etch methods typically employ plasma densities of less than about 1E9 per cubic centimeter.

When employing high density plasma reactive ion etch (HDP-RIE) plasma etch methods to form vias of diminished dimensions through silicon oxide dielectric layers within advanced integrated circuits, it is common in the art of advanced integrated circuit fabrication to employ a high carbon content fluorocarbon etchant gas, such as hexafluoroethane (C2F6), in order to provide an enhanced silicon oxide dielectric layer to photoresist etch mask layer etch selectivity which is desirable when fabricating within advanced integrated circuits high aspect ratio vias of reduced dimensions through silicon oxide dielectric layers while employing as etch mask layers photoresist layers of diminished thicknesses. While straight sided and flat bottomed vias may be formed through silicon oxide dielectric layers within advanced integrated circuits through high density plasma reactive ion etch (HDP-RIE) methods employing a high carbon content fluorocarbon etchant gas, such as hexafluoroethane (C2F6), problems are nonetheless encountered when attempting to form through such high density plasma reactive ion etch (HDP-RIE) plasma etch methods straight sided and flat bottomed vias through nitrogenated silicon oxide dielectric layers. Nitrogenated silicon oxide dielectric layers formed within advanced integrated circuits may include, but are not limited to, nitrogenated silicon oxide dielectric layers which are formed originally as silicon oxynitride layers, nitrogenated silicon oxide dielectric layers which are formed originally as silicon oxide dielectric layers through chemical vapor deposition (CVD) methods employing nitrogen carrier gas flows and nitrogenated silicon oxide dielectric layers which are formed originally as silicon oxide dielectric layers and subsequently nitrogenated through integrated circuit processes such as but not limited to nitrogen ion implantation processes and nitrogen plasma treatment processes.

A problem typically encountered when attempting to form through a nitrogenated silicon oxide layer within an advanced integrated circuit a via through a high density plasma reactive ion etch (HDP-RIE) plasma etch method while employing a high carbon content fluorocarbon etchant gas, such as hexafluoroethane (C2F6), is that the via so formed is typically formed with straight sidewalls and a rounded bottom rather straight sided sidewalls and a flat bottom. Such straight sided and round bottomed vias formed through nitrogenated silicon oxide dielectric layers within integrated circuits are typically indicative of attenuated etch rates through those nitrogenated silicon oxide dielectric layers, thus providing incompletely etched vias through those nitrogenated silicon oxide dielectric layers.

A pair of structures illustrating this problem is illustrated by reference to FIG. 1a and FIG. 1b. Shown in FIG. 1a is a substrate 10 having formed thereover a pair of patterned silicon oxide dielectric layers 12a and 12b formed through etching a corresponding blanket silicon oxide dielectric layer within a high density plasma reactive ion etch (HDP-RIE) plasma 18 employing a high carbon content fluorocarbon etchant gas, while employing a pair of patterned photoresist layers 16a and 16b as a patterned photoresist etch mask layer. As is illustrated in FIG. 1a, a via 20 defined by the pair of patterned silicon oxide dielectric layer 12a and 12b is formed with strait sidewalls and a flat bottom. In contrast, there is shown in FIG. 1b the substrate 10 having formed thereover a pair of patterned nitrogenated silicon oxide layers 14a and 14b formed through etching within the high density plasma reactive ion etch (HDP-RIE) plasma 18 employing the high carbon content fluorocarbon etchant gas, while similarly employing the pair of patterned photoresist layers 16a and 16b as the patterned photoresist etch mask layer. In contrast with the via 20 defined by the pair of patterned silicon oxide dielectric layers 12a and 12b as illustrated in FIG. 1a, the via 22 defined by the pair of patterned nitrogenated silicon oxide dielectric layers 14a and 14b as illustrated in FIG. 1b is formed with straight sidewalls and a rounded bottom. Vias formed with rounded bottoms through dielectric layers within integrated circuits are undesirable since it is often difficult to subsequently form within those round bottomed vias fully functional or reliable conductor stud layers, such as conductor contact stud layers and conductor interconnection stud layers.

While not being limited to a particular theory as to why vias when attempted to be formed through nitrogenated silicon oxide dielectric layers within advanced integrated circuits through high density plasma reactive ion etch (HDP-RIE) plasma etch methods which employ high carbon content fluorocarbon etchant gases are formed with straight sidewalls and rounded bottoms rather than straight sidewalls and flat bottoms, it is suggested that a nitrogenated carbon compound formed through reaction of: (1) carbon derived from the fluorocarbon etchant gas; with (2) nitrogen derived from the nitrogenated silicon oxide layer, forms a residue layer at the bottom of a via formed through a nitrogenated silicon oxide layer, which residue layer impedes a full anisotropic etching of the via through the nitrogenated silicon oxide layer.

It is thus desirable in the art to provide high density plasma reactive ion etch (HDP-RIE) plasma etch methods employing high carbon content fluorocarbon etchant gas compositions to form through nitrogenated silicon oxide layers within integrated circuits vias with straight sidewalls and flat bottoms. It is towards that goal that the present invention is generally directed.

Various reactive ion etch (RIE) plasma etch methods have been disclosed in the art for etching various layers within integrated circuits. For example, Xiaobing et al., in U.S. Pat. No. 5,387,556, disclose a reactive ion etch (RIE) method for etching aluminum containing layers within integrated circuits. The method employs a hydrogen chloride-chlorine-nitrogen etchant gas composition which provides a substantially anisotropic and particulate contaminant free aluminum containing layer reactive ion etch (RIE) method in comparison with otherwise conventional aluminum containing layer reactive ion etch (RIE) methods which employ a boron trichloride-chlorine-nitrogen etchant gas composition.

In addition, Yanagida, in U.S. Pat. No. 5,338,399, discloses a reactive ion etch (RIE) method for etching within integrated circuits various silicon containing dielectric layers with high etch rate, high etch selectivity and low particulate contamination. The method employs an etchant gas composition comprising a cyclic saturated fluorocarbon compound or a cyclic unsaturated fluorocarbon compound, along with a substrate temperature of less than 50 degrees centigrade.

Finally, Namose, in U.S. Pat. No. 5,294,294, discloses a reactive ion etch (RIE) method for etching with low selectivity, improved manufacturability and improved properties within integrated circuits silicon oxide layers formed with diverse properties. The method employs an etchant gas composition comprising a saturated non-cyclic fluorocarbon gas and an inert gas. The inert gas provides an adsorption layer at the etching surface of the silicon oxide layer(s) to be etched, which adsorption layer buffers fluorine radicals formed from reactive ion etch (RIE) plasma activation of the saturated non-cyclic fluorocarbon gas.

Desirable in the art are additional reactive ion etch (RIE) plasma etch methods through which vias may be formed with straight sidewalls and flat bottoms through nitrogenated silicon oxide layers within advanced integrated circuits. More particularly desirable in the art are additional high density plasma reactive ion etch (HDP-RIE) plasma etch methods through which vias, including but not limited to contact vias and interconnection vias, having straight sidewalls and flat bottoms may be formed through nitrogenated silicon oxide layers within advanced integrated circuits. It is towards the foregoing goals that the present invention is more specifically directed.

SUMMARY OF THE INVENTION

A first object of the present invention is to provide a reactive ion etch (RIE) method for forming a via through a nitrogenated silicon oxide layer within an integrated circuit.

A second object of the present invention is to provide a method in accord with the first object of the present invention, where the via is formed with straight sidewalls and a flat bottom.

A third object of the present invention is to provide a method in accord with the first object of the present invention or the second object of the present invention, where the via is selected from the group of vias including but not limited to contact vias and interconnection vias.

A fourth object of the present invention is to provide a method in accord with the first object of the present invention, the second object of the present invention or the third object of the present invention, which method is readily manufacturable.

In accord with the objects of the present invention, there is provided by the present invention a method for forming a via through a nitrogenated silicon oxide dielectric layer. To practice the method of the present invention, there is first provided a substrate. There is then formed over the substrate a nitrogenated silicon oxide layer. There is then formed upon the nitrogenated silicon oxide layer a patterned photoresist layer. Finally, the nitrogenated silicon oxide layer is etched through a reactive ion etch (RIE) plasma etch method while employing the patterned photoresist layer as a patterned photoresist etch mask layer to form a via through the nitrogenated silicon oxide layer. The reactive ion etch (RIE) method employs an etchant gas composition comprising a perfluorocarbon having a carbon fluorine atomic ratio at least about 1:3, oxygen and argon.

The present invention provides a reactive ion etch (RIE) method for forming a via through a nitrogenated silicon oxide layer within an integrated circuit, where the via is formed with straight sidewalls and a flat bottom. The method of the present invention realizes this object through employing when forming the via through the nitrogenated silicon oxide layer within the integrated circuit a reactive ion etch (RIE) plasma etch method employing an etchant gas composition comprising a perfluorocarbon having a carbon:fluorine atomic ratio at least about 1:3, oxygen and argon, In comparison with alternative etchant gas compositions which are known in the art of integrated circuit fabrication, the etchant gas composition of the present invention comprising the perfluorocarbon having the carbon:fluorine atomic ratio at least about 1:3, oxygen and argon provides through a nitrogenated silicon oxide layer avia formed with straight sidewalls and a flat bottom rather than straight sidewalls and a rounded bottom.

The method of the present invention may be employed in forming through nitrogenated silicon oxide layers vias including but not limited to contact vias and interconnection vias. The method of the present invention does not discriminate with respect to the nature of the via formed through a nitrogenated silicon oxide layer. Thus, the method of the present invention may be employed in forming through nitrogenated silicon oxide layers vias including but not limited to contact vias and interconnection vias.

The method of the present invention is readily manufacturable. The method of the present invention employs a reactive ion etch (RIE) plasma etch method employing an etchant gas composition comprising a perfluorocarbon having a carbon:fluorine atomic ratio at least about 1:3, oxygen and argon. Since reactive ion etch (RIE) plasma etch methods are generally known in several pertinent arts and plasmas are in general known in the art to be formed with etchant gas compositions including but not limited to perfluorocarbon having carbon:fluorine atomic ratios at least about 1:3, oxygen and/or argon, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1a and FIG. 1b show a pair of schematic cross sectional diagrams illustrating: (1) a flat bottomed via formed through a silicon oxide dielectric layer; and (2) a round bottomed via formed through a nitrogenated silicon oxide dielectric layer, through a high density plasma reactive ion etch (HDP-RIE) method employing a high carbon content fluorocarbon etchant gas conventional in the art of integrated circuit fabrication.

FIG. 2 to FIG. 4 show a series of schematic cross-sectional diagrams illustrating the results of progressive stages in forming through a pair of nitrogenated silicon oxide layers within an integrated circuit microelectronics fabrication a pair of flat bottomed contact vias through a high density plasma reactive ion etch (HDP-RIE) plasma etch method in accord with a preferred embodiment of the present invention.

DESCRIPTION OF THE PREFERRED EMBODIMENT

The present invention provides a method for forming through a nitrogenated silicon oxide layer within an integrated circuit a via having straight sidewalls and a flat bottom To form the via through the nitrogenated silicon oxide layer there is first provided a substrate. There is then formed over the substrate a nitrogenated silicon oxide layer. There is then formed upon the nitrogenated silicon oxide layer a patterned photoresist layer. Finally, the nitrogenated silicon oxide layer is etched through a reactive ion etch (RIE) plasma etch method while employing the patterned photoresist layer as a patterned photoresist etch mask layer to form a via through the nitrogenated silicon oxide layer. The reactive ion etch (RIE) method employs an etchant gas composition comprising a perfluorocarbon having a carbon:fluorine atomic ratio of at least about 1:3, oxygen and argon.

While the preferred embodiment of the method of the present invention illustrates the method of the present invention employed in forming a pair of vias through a pair of nitrogenated silicon oxide layers to access a pair of source/drain regions within a field effect transistor within a semiconductor substrate employed within an integrated circuit, the method of the present invention may be employed in forming vias through nitrogenated silicon oxide layers formed over substrates other than semiconductor substrates, where the substrates are employed within microelectronics fabrications other than integrated circuits. In that regard, the method of the present invention may be employed in forming vias including but not limited to contact vias and interconnection vias through nitrogenated silicon oxide layers within microelectronics fabrications including but not cited to integrated circuit microelectronics fabrications, solar cell microelectronics fabrications, ceramic packaging microelectronics fabrications and flat panel display microelectronics fabrications.

Figure 3:
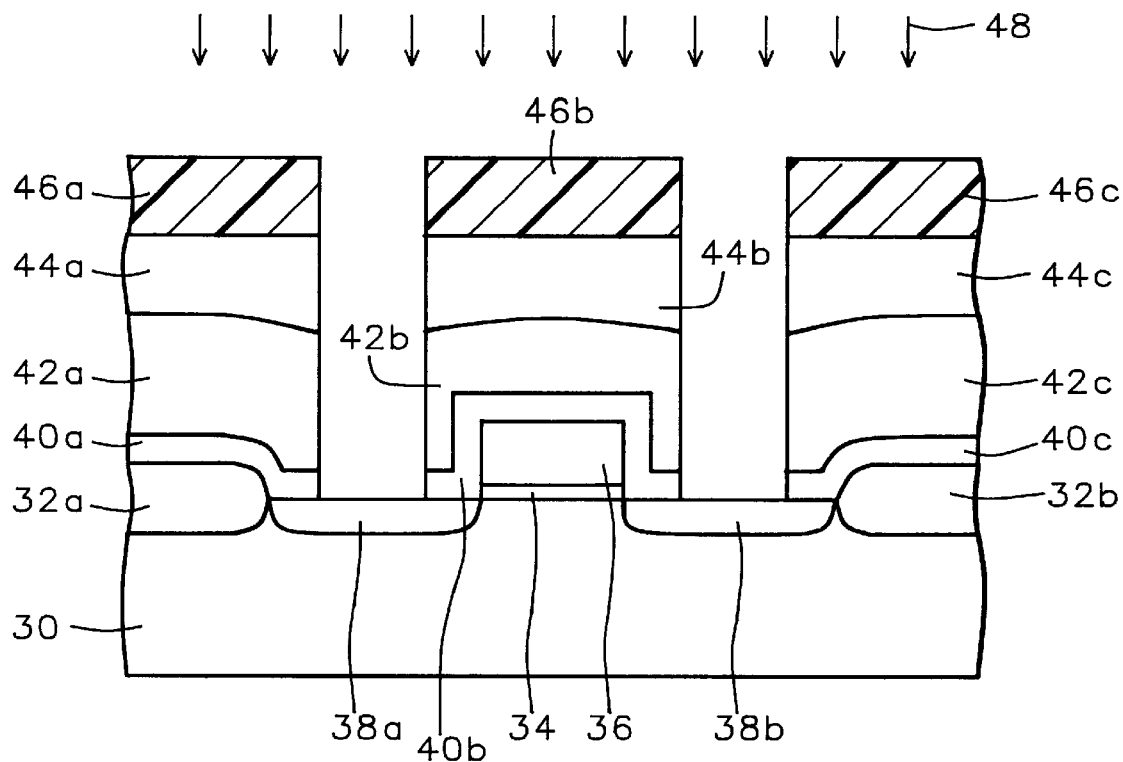
Figure 4:
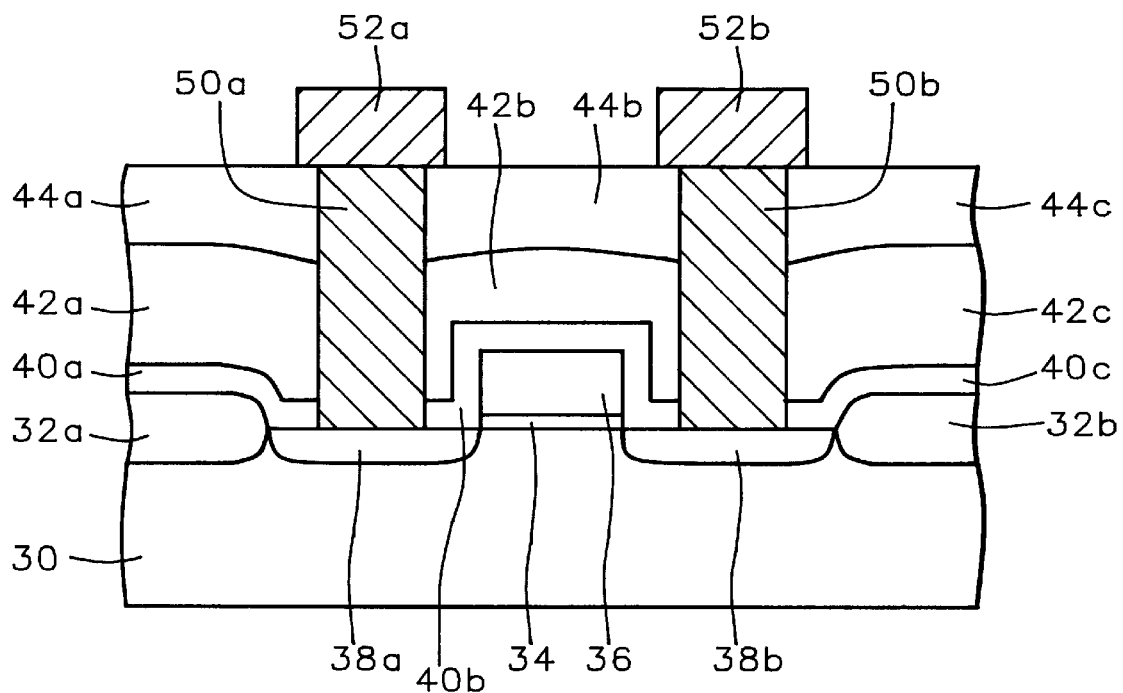

Referring now to FIG. 2 to FIG. 4, there is shown a series of schematic cross-sectional diagrams illustrating the results of progressive stages in forming within an integrated circuit microelectronics fabrication a pair of vias through a pair of nitrogenated silicon oxide dielectric layers accessing a pair of source/drain regions within a field effect transistor (FET) in accord with a preferred embodiment of the method of the present invention. Shown in FIG. 2 is a schematic-cross-sectional diagram of the integrated circuit microelectronics fabrication at an early stage in practice of the method of the present invention.

Shown in FIG. 2 is a semiconductor substrate 30 having formed therein and thereupon a pair of isolation regions 32a and 32b which define an active region of the semiconductor substrate 30. Although semiconductor substrates are known in the art of integrated circuit microelectronics fabrication to be formed with either dopant polarity, various dopant concentrations and several crystallographic orientations, for the preferred embodiment of the method of the present invention, the semiconductor substrate 30 is preferably a (100) silicon semiconductor substrate having an N- or P-doping.

Similarly, although it is also known in the art of integrated circuit microelectronics fabrication to form isolation regions within and/or upon semiconductor substrates to define active regions of those semiconductor substrates through methods including but not limited to isolation region thermal growth methods and isolation regions deposition/patterning methods, for the preferred embodiment of the present invention, the isolation regions 32a and 32b are preferably formed within and upon the semiconductor substrate 30 through a thermal growth method at a temperature of from about 900 to about 1100 degrees centigrade to form isolation regions 32a and 32b of silicon oxide within and upon the semiconductor substrate 30.

Also shown within FIG. 2, formed within and/or upon the active region of the semiconductor substrate 30 is a series of structures which forms a field effect transistor (FET). The series of structures includes a gate dielectric layer 34 formed upon the active region of the semiconductor substrate 30, a gate electrode 36 formed and aligned thereover and a pair of source/drain regions 38a and 38b formed within the active regions of the semiconductor substrate 30 at areas not covered by the gate dielectric layer 34 and the gate electrode 36. The series of structures which forms the field effect transistor (FET) may be formed through methods and materials as are common in the art of field effect transistor (FET) fabrication.

For example, although it is known in the art of field effect transistor (FET) fabrication that gate dielectric layers may be formed through methods including but not limited to gate dielectric layer thermal growth methods and gate dielectric layer deposition/patterning methods, for the preferred embodiment of the method of the present invention, the gate dielectric layer 34 is preferably formed through a gate dielectric layer thermal growth method to form the gate dielectric layer 34 of silicon oxide at a thickness about 30 to about 150 angstroms upon the active region of the semiconductor substrate 30. Similarly, although it is also known in the art of field effect transistor (FET) fabrication that gate electrodes may be formed upon gate dielectric layers through methods including but not limited to thermally assisted evaporation methods, electron beam assisted evaporation methods, physical vapor deposition (PVD) sputtering methods and chemical vapor deposition (CVD) methods to form gate electrodes of gate electrode materials including but not limited to metals, metal alloys, doped polysilicon and polycides (doped polysilicon/metal silicide stacks), for the preferred embodiment of the method of the present invention, the gate electrode 36 is preferably formed to a thickness of from about 1000 to about 4000 angstroms and aligned upon the gate dielectric layer 34 from a doped polysilicon or polycide material, as is most common in the art of field effect transistor (FET) fabrication.

Finally, the source/drain regions 38a and 38b are preferably formed within the active region of the semiconductor substrate 30 at areas not occupied by the gate dielectric layer 34 and the gate electrode 36 through an ion implantation method employing a dopant ion of polarity appropriate to the field effect transistor (FET) desired to be formed, at an ion implantation dose of from about 1E15 to about 1E16 dopant ions per square centimeter and an ion implantation energy of from about 20 to about 60 keV, as is similarly common in the art of field effect transistor (FET) fabrication.

There is also shown in FIG. 2, formed over the semiconductor substrate 30 including the structures which comprise the field effect transistor (FET) a series of three dielectric layers. The series of three dielectric layers includes: (1) a blanket conformal nitrogenated silicon oxide dielectric layer 40 formed over the semiconductor substrate 30 and contacting the structures which comprise the field effect transistor (FET) formed within and upon the active region of the semiconductor substrate 30; (2) a blanket gap filling nitrogenated silicon oxide dielectric layer 42 formed upon the blanket conformal nitrogenated silicon oxide dielectric layer 40; and (3) a blanket planarized pre-metal dielectric (PMD) layer 44 formed upon the blanket gap filling nitrogenated silicon oxide dielectric layer 42. Each of the three preceding dielectric layers may be formed through methods and materials as are conventional in the art of integrated circuit microelectronics fabrication.

In that regard, although it is known in the art of integrated circuit microelectronics fabrication that conformal nitrogenated silicon oxide layers may be formed through methods and materials including but not limited the chemical vapor deposition (CVD) methods, plasma enhanced chemical vapor deposition (PECVD) methods, thermally activated nitrogenating methods, plasma enhanced nitrogenating methods and nitrogen ion implant nitrogenating methods through which may be formed conformal nitrogenated silicon oxide layers of nitrogenated silicon oxide materials including but not limited to intrinsically nitrogenated silicon oxide materials formed as silicon oxynitride materials and extrinsically nitrogenated silicon oxide materials which are initially formed as silicon oxide materials and subsequently nitrogenated to form nitrogenated silicon oxide materials, for the preferred embodiment of the method of the present invention, the blanket conformal nitrogenated silicon oxide dielectric layer 40 is preferably formed as a blanket conformal silicon oxide layer formed through a plasma enhanced chemical vapor deposition (PECVD) method and subsequently nitrogenated through a nitrogen plasma treatment nitrogenation method. Preferably, the blanket conformal nitrogenated silicon oxide dielectric layer 40 so formed is formed to a thickness of from about 500 to about 2000 angstroms.

Preferably, the plasma enhanced chemical vapor deposition (PECVD) method through which is formed the blanket conformal silicon oxide layer from which is formed the blanket conformal nitrogenated silicon oxide dielectric layer 40 employs: (1) a reactor chamber pressure of from about 1 to about 4 torr, (2) a radio frequency power of from about 200 to about 400 watts at a radio frequency of 13.56 MH; (3) a semiconductor substrate 30 temperature of from about 350 to about 450 degrees centigrade; (4) a silane silicon source material flow rate of from about 100 to about 200 standard cubic centimeters per minute; and (5) a nitrous oxide oxidant at a flow rate of from about 1000 to about 2000 standard cubic centimeters per minute (sccm).

Preferably, the nitrogen plasma treatment method through which the blanket conformal silicon oxide layer is treated to form the blanket conformal nitrogenated silicon oxide dielectric layer 40 employs: (1) a reactor chamber pressure of from about 1 to about 3 torr; (2) a radio frequency power of from about 400 to about 500 watts at a radio frequency of 13.56 MHz; (3) a semiconductor substrate 30 temperature of from about 400 to about 500 degrees centigrade; and (4) a nitrogen flow rate of from about 300 to about 600 standard cubic centimeters per minute (sccm), for a time period of from about 60 to about 90 seconds.

Similarly, while it is also known in the art of integrated circuit microelectronics fabrication that gap filling nitrogenated silicon oxide dielectric layers may be formed within integrated circuits through nitrogenation of gap filling silicon oxide layers formed within those integrated circuits, where the gap filling silicon oxide layers are formed through an ozone assisted thermal chemical vapor deposition (CVD) method and subsequently nitrogenated through a nitrogenating method selected from the group of nitrogenating methods consisting of thermally assisted nitrogenating methods, plasma enhanced nitrogenating methods and nitrogen ion implantation nitrogenating methods, for the preferred embodiment of the present invention, the blanket gap filling nitrogenated silicon oxide dielectric layer 42 is preferably formed as a gap filling silicon oxide dielectric layer deposited through an ozone assisted sub-atmospheric pressure thermal chemical vapor deposition (SACVD) method and subsequently nitrogenated through a nitrogen plasma treatment method.

For the preferred embodiment of the method of the present invention, the ozone assisted sub-atmospheric pressure thermal chemical vapor deposition (SACVD) method through which is formed the blanket gap filling silicon oxide layer from which is formed the blanket gap filing nitrogenated silicon oxide dielectric layer 42 preferably employs: (1) a reactor chamber pressure of from about 400 to about 600 torr; (2) a semiconductor substrate 30 temperature of from about 300 to about 500 degrees centigrade; (3) a tetra ethyl ortho silicate (TEOS) silicon source material concentration of from about 200 to about 400 mg per cubic meter in a carrier gas flow of from about 2000 to about 3000 standard cubic centimeters per minute (sccm); and (4) an ozone oxidant flow rate of from about 4000 to about 6000 standard cubic centimeters per minute (sccm).

Similarly, the nitrogen plasma treatment which is employed in forming from the blanket gap filling silicon oxide layer the blanket gap filling nitrogenated silicon oxide dielectric layer 42 preferably employs: (1) a reactor chamber pressure of from about 1 to about 3 torr; (2) a radio frequency power of from about 400 to about 500 watts at a radio frequency of 13.56 MHz; (3) a semiconductor substrate temperature of from about 400 to about 500 degrees centigrade; and (4) a nitrogen flow rate of from about 300 to about 600 standard cubic centimeters per minute, for a time period of from about 60 to about 90 seconds.

Finally, although several methods and materials are known in the art of integrated circuit microelectronics fabrication through which planarized pre-metal dielectric (PMD) layers may be formed within integrated circuit microelectronics fabrications, including but not limited to chemical vapor deposition (CVD) methods, plasma enhanced chemical vapor deposition (PECVD) methods, physical vapor deposition (PVD) sputtering methods, chemical mechanical polish (CMP) planarizing methods and reactive ion etch (RIE) etchback planing methods, for the preferred embodiment of the method of the present invention, the blanket planarized pre-metal dielectric (PMD) layer 44 is preferably formed from a blanket conformal pre-metal dielectric layer formed through methods and materials analogous or equivalent to the methods and materials employed in forming the blanket conformal silicon oxide dielectric layer from which is formed the blanket conformal nitrogenated silicon oxide dielectric layer 40. The blanket conformal pre-metal dielectric layer of silicon oxide so formed may then be planarized through a chemical mechanical polish (CMP) planarizing method or a reactive ion etch (RIE) etchback planarizng method, as is conventional in the art of integrated circuit microelectronics fabrication, to form the blanket planarized pre-metal dielectric (PMD) layer 44. The blanket planarized pre-metal dielectric layer 44 so formed is preferably formed to a thickness of from about 4000 to about 12000 angstroms.

Finally, there is shown in FIG. 2 the presence of a series of patterned photoresist layers 46a, 46b and 46c formed upon the blanket planarized pre-metal dielectric (PMD) layer 44. Although the series of patterned photoresist layers 46a, 46b and 46c may be formed from any of several types of photoresist materials as are known in the art of integrated circuit microelectronics fabrications, including but not limited to photoresist materials chosen from the general groups of photoresist materials including but not limited to positive photoresist materials and negative photoresist materials, for the preferred embodiment of the method of the present invention, the series of patterned photoresist layers 46a, 46b and 46c is preferably formed from a positive photoresist material, as is most commonly employed within advanced integrated circuit microelectronics fabrications to provide patterned photoresist layers with optimal dimensional stability. Preferably, each patterned photoresist layer within the series of patterned photoresist layers 46a, 46b and 46c is formed to a thickness of from about 6000 to about 12000 angstroms, while the apertures defined by adjoining patterned photoresist layers within the series of patterned photoresist layer 46a, 46b and 46c is typically from about 0.1 to about 0.6 microns leaving exposed portions of the blanket planarized pre-metal dielectric layer 44 of that width.

Referring now to FIG. 3, there is shown a schematic cross-sectional diagram illustrating the results of further processing of the integrated circuit microelectronics fabrication whose schematic cross-sectional diagram is illustrated in FIG. 2. Shown in FIG. 3 is a schematic cross-sectional diagram of an integrated circuit microelectronics fabrication otherwise equivalent to the integrated circuit microelectronics fabrication whose schematic cross-sectional diagram is illustrated in FIG. 2, but wherein sequential portions of the blanket planarized pre-metal dielectric (PMD) layer 44, the blanket gap filing nitrogenated silicon oxide dielectric layer 42 and the blanket conformal nitrogenated silicon oxide dielectric layer 40 exposed through the series of patterned photoresist layers 46a, 46b and 46c are etched to form a pair of contact vias which leave exposed portions of the source/drain regions 38a and 38b. In so etching the portions of the blanket planarized pre-metal dielectric (PMD) layer 44, the blanket gap filling nitrogenated silicon oxide dielectric layer 42 and the blanket conformal nitrogenated silicon oxide dielectric layer 40, there is formed the corresponding patterned planarized pre-metal dielectric layers 44a, 44b and 44c; the corresponding patterned gap filling nitrogenated silicon oxide dielectric layers 42a, 42b and 42c; and the corresponding patterned conformal nitrogenated silicon oxide dielectric layers 40a, 40b and 40c.

It has been found experimentally within the preferred embodiment of the present invention that the pair of vias is preferably formed through the blanket planarized pre-metal dielectric layer 44, the blanket gap filling nitrogenated silicon oxide dielectric layer 42 and the blanket conformal nitrogenated silicon oxide dielectric layer 40 through a high density plasma reactive ion etch (HDP-RIE) plasma etch method employing a high density plasma reactive ion etch (HDP-RIE) plasma 48, although operable results may also be obtained within the method of the present invention when employing a reactive ion etch (RIE) plasma at a comparatively lower density.

Within the preferred embodiment of the method of the present invention, the high density plasma reactive ion etch (HDP-RIE) plasma 48 preferably employs an etchant gas composition comprising a perfluorocarbon having a carbon-:fluorine atomic ratio at least about 1:3, oxygen and argon. More preferably, the high density plasma preactive ion etch (HDP-RIE) plasma 48 preferably employs an etchant gas composition comprising a perfluorocarbon selected from the group of perfluorocarbon consisting of hexafluoroethane (C2F6) and octafluorocyclobutane (C4F8), along with oxygen and argon. Most preferably, the high density plasma reactive ion etch (HDP-RIE) method employs hexafluoroethane, oxygen and argon at a hexafluoroethane flow rate of from about 30 to about 50 standard cubic centimeters per minute (sccm), an oxygen flow rate of from about 2 to about 20 standard cubic centimeters per minute (sccm) and an argon flow rate of from about 20 to about 400 standard cubic centimeters per minute (sccm). Yet most preferably, the high density plasma reactive ion etch (HDP-RIE) method employs a hexafluoroethane flow rate of from about 35 to about 45 standard cubic centimeters per minute (sccm), an oxygen flow rate of from about 5 to about 10 standard cubic centimeters per minute (sccm) and an argon flow rate of from about 50 to about 100 standard cubic centimeters per minute (sccm).

Alternatively, the high density plasma reactive ion etch (HDP-RIE) plasma 48 preferably employs an etchant gas composition consisting essentially of a perfluorocarbon having a carbon:fluorine atomic ratio at least about 1:3, oxygen and argon. Similarly, more preferably, the high density plasma reactive ion etch (HDP-RIE) plasma 48 employs an etchant gas composition consisting essentially of perfluorocarbon selected from the group of perfluorocarbon consisting of hexafluoroethane and octafluorocyclobutane, along with oxygen and argon. Similarly, most preferably, the high density plasma reactive ion etch (HDP-RIE) method employs hexafluoroethane, oxygen and argon at a hexafluoroethane flow rate of from about 30 to about 50 standard cubic centimeters per minute (sccm), an oxygen flow rate of from about 2 to about 20 standard cubic centimeters per minute (sccm) and an argon flow rate of from about 20 to about 400 standard cubic centimeters per minute (sccm). Similarly, yet most preferably, the high density plasma reactive ion etch (HDP-RE) method employs a hexafluoroethane flow rate of from about 35 to about 45 standard cubic centimeters per minute (sccm), an oxygen flow rate of from about 5 to about 10 standard cubic centimeters per minute (sccm) and an argon flow rate of from about 50 to about 100 standard cubic centimeters per minute (sccm).

Other conditions employed within the high density plasma reactive ion etch (HDP-RIE) plasma etch method include: (1) a reactor chamber pressure of from about 2 to about 15 mtorr; (2) a radio frequency source power of from about 1500 to about 3000 watts at a source radio frequency of 2 MHz and a radio frequency bias power of from about 1000 to about 1800 watts at a bias radio frequency of 1.8 MHz; and (3) a semiconductor substrate 30 temperature of from about 90 to about 150 degrees centigrade. Preferably, the high density plasma reactive ion etch (HDP-RIE) plasma etch method is employed until the pair of vias is formed fully exposing the surfaces of the pair of source/drain regions 38a and 38b. As is illustrated in FIG. 3, the pair of vias so formed is formed with straight sidewalls and flat bottoms, rather than straight sidewalls and rounded bottoms as are analogous vias otherwise formed through nitrogenated silicon oxide layers within integrated circuit microelectronics fabrications through reactive ion etch (RIE) methods as are conventional in the art of integrated circuit microelectronics fabrications.

Referring now to FIG. 4, there is shown a schematic cross-sectional diagram illustrating the results of further processing of the integrated circuit microelectronics fabrication whose schematic cross-sectional diagram is illustrated in FIG. 3. Shown in FIG. 4 is a schematic cross-sectional diagram of an integrated circuit microelectronics fabrication otherwise equivalent to the integrated circuit microelectronics fabrication whose schematic cross-sectional diagram is illustrated in FIG. 4, but wherein: (1) the patterned photoresist layers 46a, 46b and 46c have been stripped from the surface of the integrated circuit microelectronics fabrication; (2) there has been formed within the pair of vias accessing the pair of source drain regions 38a and 38b a pair of conductive contact studs 50a and 50b; and, (3) there is formed over the integrated circuit microelectronics fabrication contacting each of the conductive contact studs 50a or 50b within the pair of conductive contact studs a patterned conductor layer 52a or 52b. Each of the preceding structures may be stripped from or formed upon the integrated circuit microelectronics fabrication whose schematic cross-sectional diagram is shown in FIG. 3 to form the integrated circuit microelectronics fabrication whose schematic cross-sectional diagram is illustrated in FIG. 4 through methods as are conventional in the art of integrated circuit microelectronics fabrication. For example, although it is known in the art of integrated circuit microelectronics fabrication that photoresist layers may be stripped from integrated circuit microelectronics fabrications through methods including but not limited to wet chemical stripping methods and dry plasma stripping methods, for the preferred embodiment of the method of the present invention, the patterned photoresist layers 46a, 46b and 46c are preferably stripped from the integrated circuit microelectronics fabrication whose schematic cross-sectional diagram is illustrated in FIG. 3 to form the integrated circuit microelectronics fabrications whose schematic cross-sectional diagram is illustrated in FIG. 4 through a dry plasma stripping method employing an oxygen stripping gas.

Similarly, although it is also known in the art of integrated circuit microelectronics fabrication that conductor stud layers and patterned conductor layers may be formed within integrated circuit microelectronics fabrications through methods including but not limited to thermally assisted evaporation methods, electron beam assisted evaporation methods, chemical vapor deposition (CVD) methods and physical vapor deposition (PVD) sputtering methods through which may be formed conductor stud layers and patterned conductor layers of metals, metal alloys, doped polysilicon and polycides, for the preferred embodiment of the method of the present invention, the conductor contact stud layers 50a and 50b are preferably formed at least in part of a tungsten conductor stud material deposited through a chemical vapor deposition (CVD) method, as is most common in the art of integrated circuit microelectronics fabrication, while the patterned conductor layers 52a and 52b are preferably formed at least in part of an aluminum containing conductor material, as is similarly also common in the art of integrated circuit microelectronics fabrication.

Upon forming the integrated circuit microelectronics fabrication whose schematic cross-sectional diagram is illustrated in FIG. 4, there is formed an integrated circuit microelectronics fabrication having formed therein a pair of conductor contact stud layers formed through two nitrogenated silicon oxide layers, where the pair of conductor contact stud layers formed through the two nitrogenated silicon oxide layers is formed with enhanced functionality and reliability since a pair of vias formed through the two nitrogenated silicon oxide layers is formed with straight sides and flat bottoms rather than straight sides and rounded bottoms.

As is understood by a person sided in the art, the preferred embodiment of the present invention is illustrative of the present invention rather than limiting of the present invention Revisions and modifications may be made to methods, materials, structures and dimensions through which practiced the preferred embodiment of the present invention while still providing embodiments which are within the spirit and scope of the present invention, as defined by the appended claims.

What is claimed is:

1. A method for forming a via through a nitrogenated silicon oxide layer comprising:

providing a substrate;

forming over the substrate a nitrogenated silicon oxide layer;

forming the nitrogenated silicon oxide layer a patterned photoresist layer; and etching the nitrogenated silicon oxide layer through a reactive ion etch (RIE) plasma etch method while employing the patterned photoresist layer as a patterned photoresist etch mask layer to form a via through the nitrogenated silicon oxide layer, the reactive ion etch (RIE) plasma etch method employing an etchant gas composition comprising:

a perfluorocarbon selected from the group consisting of hexafluoroethane (C2F6) and octafluorocyclobutane (C4F8);

oxygen;and argon.

2. The method of claim 1 wherein the via is formed through the nitrogenated silicon oxide layer with straight sidewalls and a flat bottom.

3. The method of claim 1 wherein the substrate is a substrate chosen from the group of substrates consisting of substrates employed within integrated circuit microelectronics fabrications, solar cell microelectronics fabrications, ceramic packaging microelectronics fabrications and flat panel display microelectronics fabrications.

4. The method of claim 1 wherein the nitrogenated silicon oxide layer is formed through a nitrogen plasma treatment of a silicon oxide layer.

5. The method of claim 1 wherein the reactive ion etch (RIE) method employs:

hexafluoroethane at a hexafluoroethane flow rate of from about 30 to about 50 standard cubic centimeters per minute (sccm);

an oxygen flow rate of from about 2 to about 20 standard cubic centimeters per minute (sccm) and;

an argon flow rate of from about 20 to about 400 standard cubic centimeters per minute.

6. The method of claim 5 wherein the reactive ion etch (RIE) method is a high density plasma reactive ion etch (HDP-RIE) method which employs a reactor chamber pressure of from about 2 to about 15 mtorr, a radio frequency source power of from about 1500 to about 3000 watts at a source radio frequency of 2 MHz and a radio frequency bias power of from about 1000 to about 1800 watts at a bias radio frequency of 1.8 MHz.

* * * * *

UNITED STATES PATENT AND TRADEMARK OFFICE
CERTIFICATE OF CORRECTION

PATENT NO.   : 5,904,566
DATED        : May 18, 1999
INVENTOR(S)  : Tao et al.

It is certified that error appears in the above-identified patent and that said Letters Patent is hereby corrected as shown below:

Column 12,
Line 22, insert -- over -- between "forming" and "the".

Signed and Sealed this

Sixth Day of January, 2004

JAMES E. ROGAN
*Director of the United States Patent and Trademark Office*